United States Patent
Ganguli et al.

(10) Patent No.: US 8,895,443 B2
(45) Date of Patent: Nov. 25, 2014

(54) N-METAL FILM DEPOSITION WITH INITIATION LAYER

(75) Inventors: Seshadri Ganguli, Sunnyvale, CA (US); Xinliang Lu, Fremont, CA (US); Atif Noori, Saratoga, CA (US); Maitreyee Mahajani, Saratoga, CA (US); Shih Chung Chen, Cupertino, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 106 days.

(21) Appl. No.: 13/525,604

(22) Filed: Jun. 18, 2012

(65) Prior Publication Data

US 2012/0322250 A1    Dec. 20, 2012

Related U.S. Application Data

(60) Provisional application No. 61/498,908, filed on Jun. 20, 2011.

(51) Int. Cl.
    *H01L 21/44* (2006.01)
    *H01L 21/28* (2006.01)

(52) U.S. Cl.
    CPC ............................ *H01L 21/28088* (2013.01)
    USPC .............. 438/685; 438/677; 257/E21.496; 257/E21.478

(58) Field of Classification Search
    CPC .............................................. H01L 21/28088
    USPC .......... 438/677, 628, 683, 685; 257/E21.496; 257/E21.478
    See application file for complete search history.

(56) References Cited

U.S. PATENT DOCUMENTS

| | | | |
|---|---|---|---|
| 5,055,246 A | 10/1991 | Jalby et al. | |
| 6,511,609 B2 | 1/2003 | Jan et al. | |
| 7,183,208 B2 | 2/2007 | Doan et al. | |
| 7,220,312 B2 | 5/2007 | Doan et al. | |
| 2005/0045092 A1* | 3/2005 | Wu et al. | 117/92 |
| 2006/0211224 A1 | 9/2006 | Matsuda | |
| 2006/0249847 A1 | 11/2006 | Eriksen et al. | |
| 2007/0166970 A1* | 7/2007 | Triyoso et al. | 438/585 |
| 2008/0113110 A1* | 5/2008 | Elers et al. | 427/577 |
| 2008/0223287 A1* | 9/2008 | Lavoie et al. | 117/94 |
| 2008/0280438 A1 | 11/2008 | Lai et al. | |
| 2009/0032952 A1 | 2/2009 | Chen et al. | |

OTHER PUBLICATIONS

PCT International Search Report in PCT/US2012/043256, mailed Jul. 25, 2013, 15 pgs.

* cited by examiner

*Primary Examiner* — Caridad Everhart

(74) *Attorney, Agent, or Firm* — Servilla Whitney LLC (57) ABSTRACT

Provided are methods of depositing N-Metals onto a substrate. Some methods comprise providing an initiation layer of TaM or TiM layer on a substrate, wherein M is selected from aluminum, carbon, noble metals, gallium, silicon, germanium and combinations thereof; and exposing the substrate having the TaM or TiM layer to a treatment process comprising soaking the surface of the substrate with a reducing agent to provided a treated initiation layer.

17 Claims, 12 Drawing Sheets

N-METAL FILM DEPOSITION WITH INITIATION LAYER

CROSS-REFERENCE TO RELATED APPLICATIONS

The application claims the benefit under 35 U.S.C. 119(e) of U.S. Provisional Application No. 61/498,908, filed Jun. 20, 2011.

FIELD

The present invention relates generally to methods of forming a metal gate in semiconductor devices. More particularly, the disclosed method relates to a method of depositing an N-Metal film, such as $TaC_x$ or $TaSi_x$, onto a gate-insulating substrate.

BACKGROUND

Integrated circuit technology continues to rapidly advance, with many circuit technologies being implemented using semiconductor fabrication processes. A variety of electrically conducting material is available for implementing the layers in the gates of semiconductor integrated circuits.

As is well known in the art, a silicon oxide film has been mainly used as a material of a gate insulating film in MOSFETs, and a polysilicon film has been used as a material of the gate. However, as the integration level of the semiconductor devices becomes higher, it is required that the line width of the gate and the thickness of the gate insulating film be reduced. In the case where a silicon oxide film is used as the material of the gate insulating film, if the thickness of the gate insulating film is too thin, the insulating characteristic is not stable, as the leakage current due to a direct tunneling through the gate insulating film becomes greater. Recently there has been an effort to use a high dielectric constant material having a relatively higher dielectric constant than a silicon oxide film as the material of the gate insulating film. Also, in order to minimize the polysilicon gate depletion effect, there has been an effort to use a metal gate instead of the polysilicon gate.

However, N-Metal films such as $TaC_x$ and $TaSi_x$ cannot be easily deposited directly onto several substrates used for gate insulating layers, including $HfO_2$ or TiN. Before the present invention, deposition of $TaSi_x$ on any substrate required very long incubation periods to initiate deposition of the N-metal. Even after a $TaSi_x$ film was obtained, it was generally rough in texture.

Therefore, there is a need to provide methods that allow for suitable N-Metal film deposition onto gate insulation substrates.

SUMMARY OF THE INVENTION

Provided are methods of depositing N-Metals onto a substrate. A first aspect of the invention relates to a method of forming a metal layer on a substrate surface. The method comprises providing an initiation layer of TaM or TiM layer on a substrate, wherein M is selected from aluminum, carbon, noble metals, gallium, silicon, germanium and combinations thereof; and exposing the substrate having the TaM or TiM layer to a treatment process comprising soaking the surface of the substrate with a reducing agent to provided a treated initiation layer.

Variants of this aspect include selecting a particular reducing agent. In one or more embodiments, the reducing agent comprises one or more of $SiH_4$, $B_2H_6$, alkyl tins, alkyl zincs, and aluminum hydrides. In one or more embodiments, the method may further comprise depositing a metal layer upon the treated initiation layer, wherein the metal layer comprises a metal alloy selected from the group consisting of $TaSi_x$, $TiSi_x$, $TaGe_x$, $TiGe_x$ and $TaC_x$. In one or more embodiments, wherein the value of x has a range of about 2.5 to about 0.1. In further embodiments, the initiation layer or metal layer may comprise aluminum dopant. In yet further embodiments, the metal layer can comprise $TaSi_x$ doped with aluminum. In one or more embodiments, the initiation layer comprises TaAlC. Embodiments relating to TaAlC may include the TaAlC initiation layer deposited via an atomic layer deposition process with $TaCl_5$ and triethyl aluminum precursors. In specific embodiments, the metal layer comprises $TaSi_x$ or $TaC_x$. In one or more embodiments, the substrate may comprise an oxide, TiN or TaN surface. In a some embodiments, the layer of the metal layer is less than about 50 Angstroms.

A second aspect of the invention also relates to a method of depositing a metal layer. The method comprises depositing an initiation layer of TaM or TiM onto a substrate, wherein M is selected from aluminum, carbon, noble metals, gallium, silicon, germanium and combinations thereof; exposing the substrate having the TaM or TiM layer to a treatment process comprising soaking the surface of the substrate with a reducing agent to provided a treated initiation layer; and depositing a metal layer upon the treated initiation layer, wherein the metal layer comprises a metal alloy selected from the group consisting of $TaSi_x$, $TiSi_x$, $TaGe_x$, $TiGe_x$ and $TaC_x$. The same variants as with the first aspect can be used. Thus, for example, the initiation layer may comprise $TaSi_x$ doped with aluminum or TaAlC. In another embodiment, the reducing agent comprises one or more of $SiH_4$, $B_2H_6$, alkyl tins, alkyl zincs, and aluminum hydrides. In yet another embodiment, the metal layer comprises $TaSi_x$ doped with aluminum. In one or more embodiments, the value of x has a range of about 0.1 to about 2.5.

A third aspect of the invention also relates to a method for forming a metal layer on a substrate surface. The method comprises: exposing a substrate to a first reactant gas comprising $TaCl_5$; exposing the substrate to a second reactant gas comprising triethyl aluminum to form a TaAlC layer on the substrate during an atomic layer deposition process; exposing the substrate having the TaAlC layer to a treatment process comprising soaking the surface of the substrate with a reducing agent to provided a treated initiation layer; depositing a metal layer, wherein the metal layer comprises a metal alloy selected from the group consisting of $TaSi_x$, $TiSi_x$, $TaGe_x$, $TiGe_x$ and $TaC_x$. Again, any of the previous variants can be utilized. Thus, for example, in one embodiment, the reducing agent comprises one or more of $SiH_4$, $B_2H_6$, alkyl tins, alkyl zincs, and aluminum hydrides. In a second embodiment, the initiation layer or metal layer comprises aluminum dopant. In a third embodiment, the value of x has a range of about 0.1 to about 2.5.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 9A and 9B show twenty-five cycles of $TaSi_x$ deposited at 350° C. onto a $HfO_2$ substrate using a TaAlC nucleation layer. FIGS. 9C and D show twenty-five cycles of $TaSi_x$ deposited at 400° C. onto a $SiO_2$ substrate using a TaAlC nucleation layer.

FIGS. 10A and 10B show twenty-five cycles of $TaSi_x$ deposited at 450° C. onto a $HfO_2$ substrate using a TaAlC nucleation layer. FIGS. 10C and 10D show twenty-five cycles of $TaSi_x$ deposited at 500° C. onto a $HfO_2$ substrate using a TaAlC nucleation layer.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Embodiments of the present invention pertain to methods of depositing a metal layer on a substrate. Certain embodiments described herein particularly pertain to deposition of an initiation layer to facilitate deposition of the metal layer. Furthermore, certain embodiments of the present invention relate to the deposition of $TaSi_x$.

As used herein, "initiation layer" is used synonymously with "nucleation layer," "catalyst layer". These terms are used to describe a deposition layer that is deposited prior to and to aid in the deposition of a desired N-metal layer, such as $TaSi_x$. While not wishing to be bound by a particular theory, according to one or more embodiments, the initiation layer or nucleation layer catalytically promotes the growth of the N-metal layer when such growth was not previously possible in the absence of the initiation layer or nucleation layer.

As used herein, "soak" or "soaking" refers to a process wherein a substrate is exposed to a reactant gas, and the gas reacts with the surface, but does not deposit a layer. In one or more embodiments, the reactant gas comprising a reducing agent. In one more embodiments, the reactant gas can comprise other gases, such as diluents and/or inert gases. This may be advantageously done to achieve a desired partial pressure in the chamber. An non-limiting example of such a soak process would be to flow silane ($SiH_4$) onto a substrate surface comprising a TiN film. Si may get added to the film to form TiSiN. The amount of Si that gets added will depend on the temperature of the wafer, the time of the soak, and the partial pressure of the reactant gas.

It has been surprisingly discovered that certain surface treatments can greatly increase the effectiveness and efficiency of the deposition of N-metal films. In a particular embodiment, TaAlC has been discovered as an initiation layer that greatly facilitates the deposition of $TaSi_x$. Additionally, it has been discovered that soaking the substrate surface with a reducing agent, with or without the initiation layer, results in much smoother surfaces. This is particularly useful if high temperatures will be used to deposit $TaSi_x$.

Figure 1A:
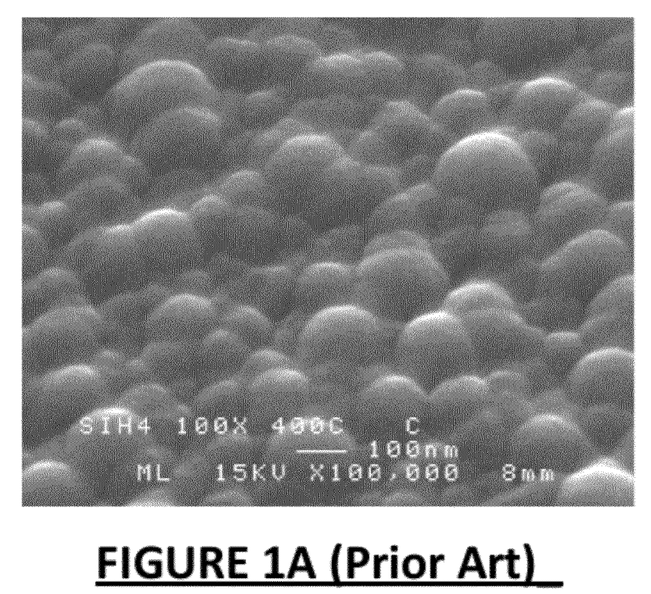
FIGS. 1A and 1B (prior art) show scanning electron microscope images of $TaSi_x$ deposited directly onto a substrate using $TaF_5$ and $SiH_4$ precursors.
Figure 1B:
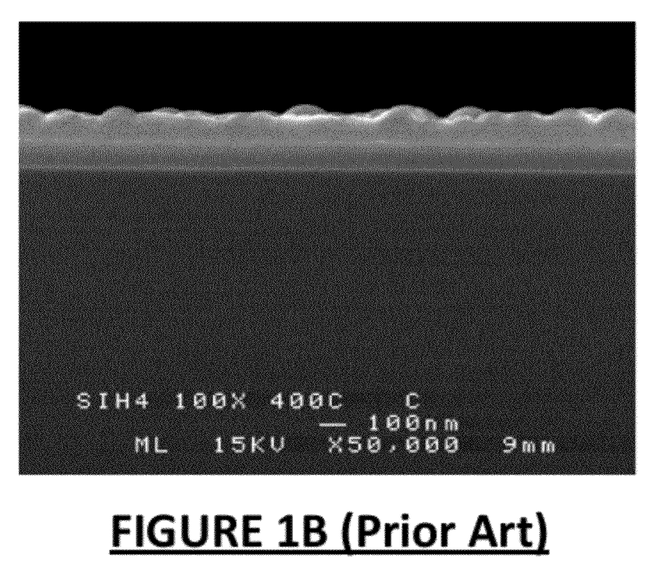
Figure 2A:
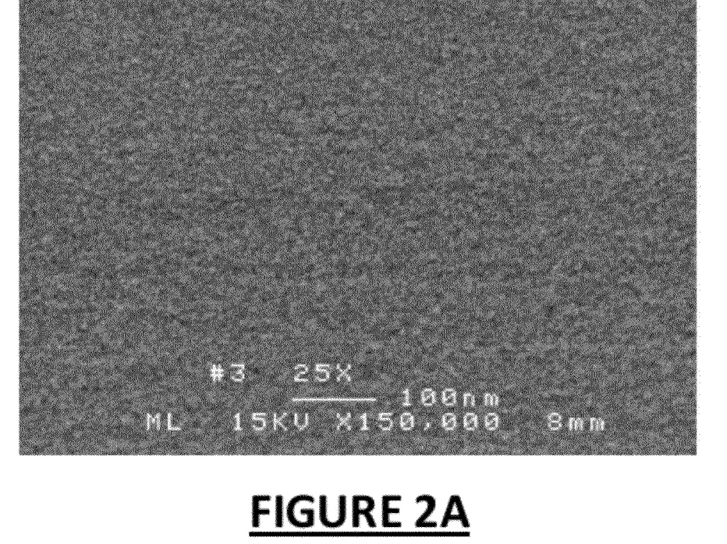
FIGS. 2A and 2B show scanning electron microscope images of $TaSi_x$ deposited onto a TaAlC nucleation layer using $TaF_5$ and $SiH_4$ precursors.
Figure 2B:
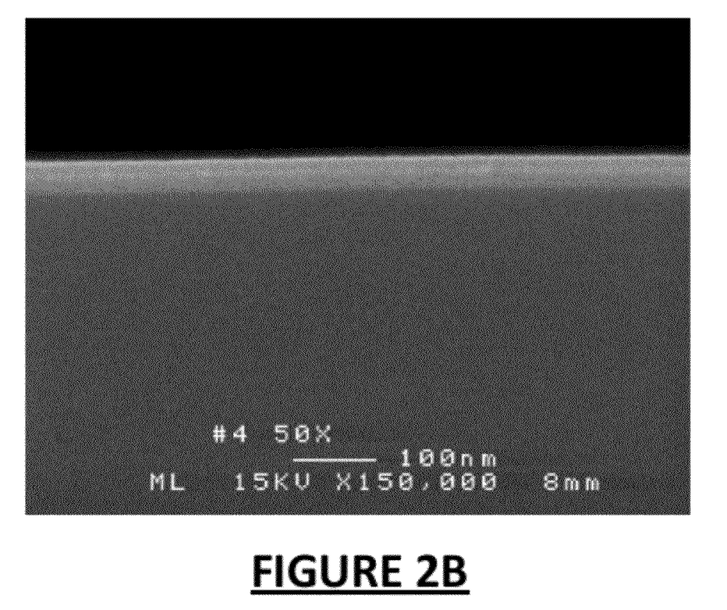

Normally, $TaSi_x$ deposition directly onto a substrate requires very long incubation periods and results in a rough deposition surface. For example, FIGS. 1A and 1B show a scanning electron microscope image of $TaSi_x$ deposited directly onto a substrate using $TaF_5$ and $SiH_4$ as precursors. As can be seen, the resulting $TaSi_x$ layer is very rough, which is disadvantageous for integration. In contrast, FIGS. 2A and 2B show scanning electron microscope images of $TaSi_x$ deposited onto a TaAlC nucleation layer using $TaF_5$ and $SiH_4$ as precursors. The images show a much smoother appearance. As such, TaAlC, and related compounds discussed below, act as an initiation/nucleation layer, catalyzing the deposition of tantalum and titanium compounds.

Accordingly, one aspect of the invention relates to a method for forming a metal layer on a substrate surface, the method comprising: providing an initiation layer of TaM or TiM layer on a substrate, wherein M is selected from aluminum, carbon, noble metals, gallium, silicon, germanium and combinations thereof; and exposing the substrate having the TaM or TiM layer to a treatment process comprising soaking the surface of the substrate with a reducing agent to provided a treated initiation layer.

As used herein, "noble metals" refer to ruthenium rhodium, palladium, silver, osmium, iridium, platinum, and gold. This process may also comprise repeating sequentially the atomic layer deposition process and the treatment process.

The method may optionally include depositing a metal layer upon the treated initiation layer, wherein the metal layer comprises a metal alloy selected from the group consisting of $TaSi_x$, $TiSi_x$, $TaGe_x$, $TiGe_x$ and $TaC_x$. In one or more embodiments, the initiation layer or metal layer comprises aluminum dopant. For example, the metal layer may comprise $TaSi_x$ doped with aluminum. Doping with aluminum can decrease the work function of a film.

Accordingly, another aspect of the invention relates to a method of depositing a metal layer, the method comprising depositing an initiation layer of TaM or TiM onto a substrate, wherein M is selected from aluminum, carbon, noble metals, gallium, silicon, germanium and combinations thereof; exposing the substrate having the TaM or TiM layer to a treatment process comprising soaking the surface of the substrate with a reducing agent to provided a treated initiation layer; and depositing a metal layer upon the treated initiation layer, wherein the metal layer comprises a metal alloy selected from the group consisting of $TaSi_x$, $TiSi_x$, $TaGe_x$, $TiGe_x$ and $TaC_x$.

There are many variants of the methods described herein. For example, the value of "x" in the deposited metal layer depends upon two factors. The first factor is the work function. The work function is the minimum energy (usually measured in electron volts) needed to remove an electron from a solid to a point immediately outside the solid surface (or energy needed to move an electron from the Fermi level into vacuum). Typically, a value of the work function less than or equal to 4 is desired for an n material. The work function for an N-metal is usually less than 4.5 eV. The valve varies, depending on the doping of the gate channel. The second factor is the resistivity of the film. In general, the value of X will be in the range of about 0.1 to about 2.5.

The reducing agent can be any suitable reducing agent known in the art. Examples include, but are not limited to, reducing agents comprising one or more of $SiH_4$, $B_2H_6$, alkyl tins, alkyl zincs, and aluminum hydrides.

In a particular embodiment, the initiation layer comprises TaAlC. TaAlC may be deposited using an atomic layer deposition process using $TaCl_5$ and TEA as precursors. In a further embodiment of the invention, the substrate comprises an oxide, TiN or TaN surface. In yet a further embodiment the metal layer comprises $TaSi_x$ or $TaC_x$. $TaSi_x$ can be deposited during an atomic layer deposition using precursors selected from $TaCl_5$, $TaF_5$, $SiH_4$, $Si_2H_6$ and combinations thereof. $TaC_x$ may also be deposited via atomic layer deposition using $TaCl_5$ and a carbon source gas as precursors. The carbon source gas may have either at least one double or triple bond and may range from $C_1$ to $C_6$. One example of a carbon source gas suitable for the deposition of $TaC_x$ is ethylene.

Accordingly, another aspect of the invention relates to a method for forming a metal layer on a substrate surface, the method comprising: exposing a substrate to a first reactant gas comprising $TaCl_5$; exposing the substrate to a second reactant gas comprising triethyl aluminum to form a TaAlC layer on the substrate during an atomic layer deposition process; exposing the substrate having the TaAlC layer to a treatment process comprising soaking the surface of the substrate with a reducing agent to provided a treated initiation layer; and depositing a metal layer, wherein the metal layer comprises a metal alloy selected from the group consisting of $TaSi_x$, $TiSi_x$, $TaGe_x$, $TiGe_x$ and $TaC_x$. The same variants as before can be used with this process. Thus, for example, the reducing agent may comprise one or more of $SiH_4$, $B_2H_6$, alkyl tins, alkyl zincs, and aluminum hydrides. In one or more embodiments, the initiation layer or metal layer comprises aluminum dopant or the value of x has a range of about 0.1 to about 2.5.

The metal layer that is deposited onto the initiation layer can vary in thickness. Commercial demands usually require a metal layer of about 50 Angstroms or thinner, with an error margin of about 5 Angstroms. Thus, in one embodiment, the metal layer is less than about 50 Angstroms. This is especially true where the fill material in a trench is different than the work function material. However, with certain N-metals, such as $TaSi_x$ resistivity may be low enough such that the entire trench may be filled with only one metal. Thus in another embodiment, where only $TaSi_x$ is used, the metal layer may be thicker than 50 Angstroms.

Additionally, a very high level of control is necessary to monitor deposition thickness to within 5 Angstroms. The long incubation periods that plague $TaSi_x$ deposition directly onto a substrate make it very difficult to control the thickness of the deposition. However, with an initiation layer, control of deposition thickness is gained. Thus, deposition with an initiation layer produces superior results.

Another aspect of the invention relates to a method of depositing a metal layer, the method comprising depositing an initiation layer of TaM or TiM onto a substrate, wherein M is selected from aluminum, carbon, noble metals, gallium, silicon, germanium and combinations thereof; depositing a metal layer, wherein the metal layer comprises a metal alloy selected from the group consisting of $TaSi_x$, $TiSi_x$, $TaGe_x$, $TiGe_x$ and $TaC_x$. Again the value of X has a range of about 0.1 to about 2.5. In a specific embodiment, the initiation layer comprises TaAlC. In another embodiment, the process further comprises soaking the surface of the substrate with $SiH_4$. In yet another embodiment, the metal layer comprises $TaSi_x$, which can be deposited using precursors selected from the group consisting of $TaCl_5$, $TaF_5$, $SiH_4$, $Si_2H_6$ and combinations thereof. As before, the substrate may comprise an oxide, TiN or TaN surface. The metal layer may have any thickness thickness suitable for the desired end use. Examples of suitable thicknesses include a thickness of less than about 100 Angstroms or of less than about 50 Angstroms.

Alternatively, the process may consist essentially of depositing a metal layer, the method comprising depositing an initiation layer of TaM or TiM onto a substrate, wherein M is selected from aluminum, carbon, noble metals, gallium, silicon, germanium and combinations thereof; depositing a metal layer, wherein the metal layer comprises a metal alloy selected from the group consisting of $TaSi_x$, $TiSi_x$, $TaGe_x$, $TiGe_x$ and $TaC_x$.

There are several ways of depositing a TaAlC layer. For example, TaAlC may be deposited via atomic layer deposition using $TaCl_5$ and triethyl aluminum (TEA) precursors. Accordingly, another aspect of the invention relates to a method for forming a metal layer on a substrate surface, the method comprising: exposing a substrate to a first reactant gas of the formula $TaCl_5$, and a second reactant gas of triethyl aluminum to form a TaAlC layer on the substrate during an atomic layer deposition process; exposing the substrate having the TaAlC layer to a treatment process to remove at least some of the unreacted first and second reactant gases; depositing a metal layer, wherein the metal layer comprises a metal alloy selected from the group consisting of $TaSi_x$, $TiSi_x$, $TaGe_x$, $TiGe_x$ and $TaC_x$. The substrate may either be exposed sequentially or contemporaneously to the two precursor gases. As with before, this method may further comprise soaking the surface with $SiH_4$, and the substrate may comprise an oxide, TiN or TaN surface. The value of x in the metal layer compound may have a range of about 0.1 to about 2.5. Again, the metal layer may be less than about 50 Angstroms. Additionally if the metal layer comprises $TaSi_x$, it can be deposited using precursors selected from the group consisting of $TaCl_5$, $TaF_5$, $SiH_4$, $Si_2H_6$ and combinations thereof.

Alternatively, this process may consist essentially of exposing a substrate to a first reactant gas of the formula $TaCl_5$, and a second reactant gas of triethyl aluminum to form a TaAlC layer on the substrate during an atomic layer deposition process; exposing the substrate having the TaAlC layer to a treatment process to remove at least some of the unreacted first and second reactant gases; depositing a metal layer, wherein the metal layer comprises a metal alloy selected from the group consisting of $TaSi_x$, $TiSi_x$, $TaGe_x$, $TiGe_x$ and $TaC_x$.

Any of the deposited layers may be formed using atomic layer deposition, chemical vapor deposition, plasma vapor deposition, and plasma enhanced atomic layer deposition. A particular method may be selected depending on the specific circumstances, and is well within the knowledge of one of ordinary skill in the art.

For example, in some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path. Thus, in embodiments relating to soaking with a reducing agent, it may be advantageous to do one or more film depositions in the same chamber as the soak. Alternatively, they may be carried out in different chambers, but without a vacuum break. In other embodiments, deposition and soaking may take place in different chambers.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/ cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

EXAMPLES

Example 1

Comparative $TaSi_x$ deposited directly onto a substrate using $TaF_5$ and $SiH_4$ as precursors. FIGS. 1A and 1B show a scanning electron microscope image of the resulting $TaSi_x$ deposition layer from the top and cross-sectional views, respectively. The surface is clearly rough and not uniform in nature.

Example 2

Figure 3:
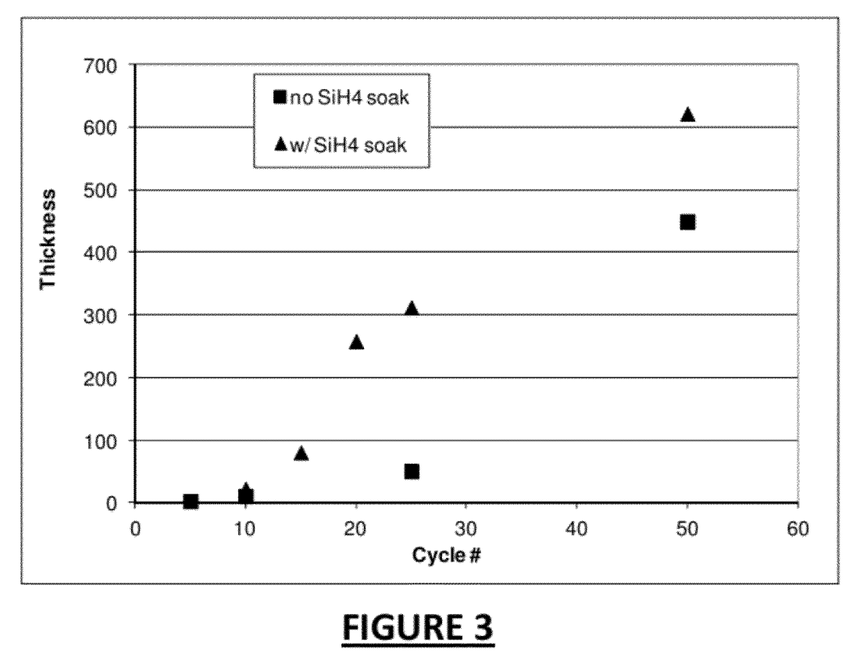
FIG. 3 is a graphical representation of $TaSi_x$ thickness deposited versus the number of deposition cycles. The graph shows thickness of $TaSi_x$ with (dark triangular markers) and without (light square markers) a $SiH_4$ soak.

$TaSi_x$ was deposited directly onto a substrate using $TaF_5$ and $SiH_4$ as precursors in an atomic layer deposition process. $TaSi_x$ was then deposited using the same precursors after soaking the substrate with silane. FIGS. 2A and 2B are scanning electron microscope images of the resulting film, showing top and cross-sectional views, respectively. The film demonstrate a much smoother and uniform appearance. FIG. 3 is a graphical representation of $TaSi_x$ thickness deposited versus the number of deposition cycles. The graph shows thickness of $TaSi_x$ with (dark trianglar markers) and without (light square markers) a $SiH_4$ soak. The silane-soaked surface demonstrates a greater deposition thickness more quickly than that without silane soaking.

Example 3

Figure 4:
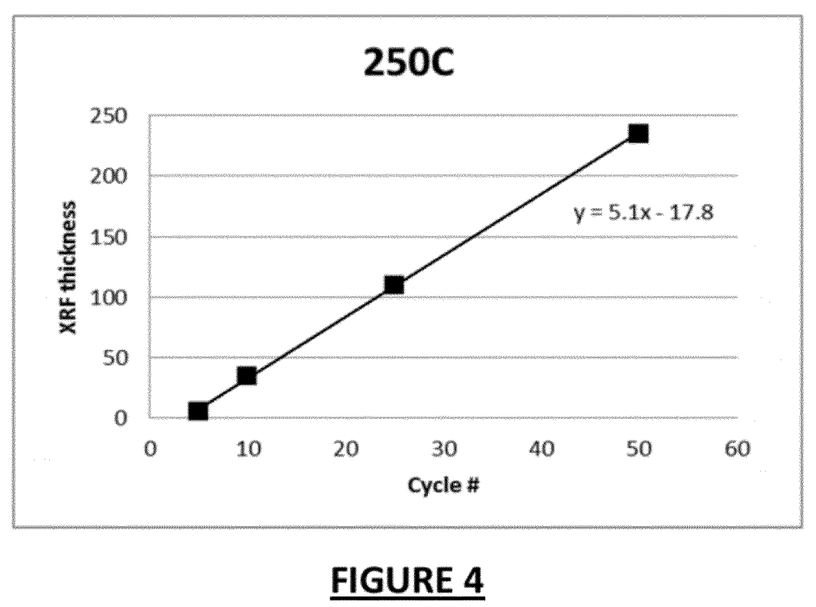
FIG. 4 is a graph showing $TaSi_x$ thickness versus deposition cycle carried out at 250° using TaAlC as a nucleation layer. $TaSi_x$ was formed using $TaF_5$ and $SiH_4$ as precursors.

$TaSi_x$ was deposited onto a substrate with a TaAlC nucleation layer. $TaSi_x$ was deposited during an atomic layer deposition using $TaF_5$ and $SiH_4$ as precursors. The deposition was carried out at 250°. FIG. 4 is a graphical representation of $TaSi_x$ thickness versus deposition cycle carried out at 250°. The film resistivity was about 250-300 μohm-cm.

Example 4

Figure 5:
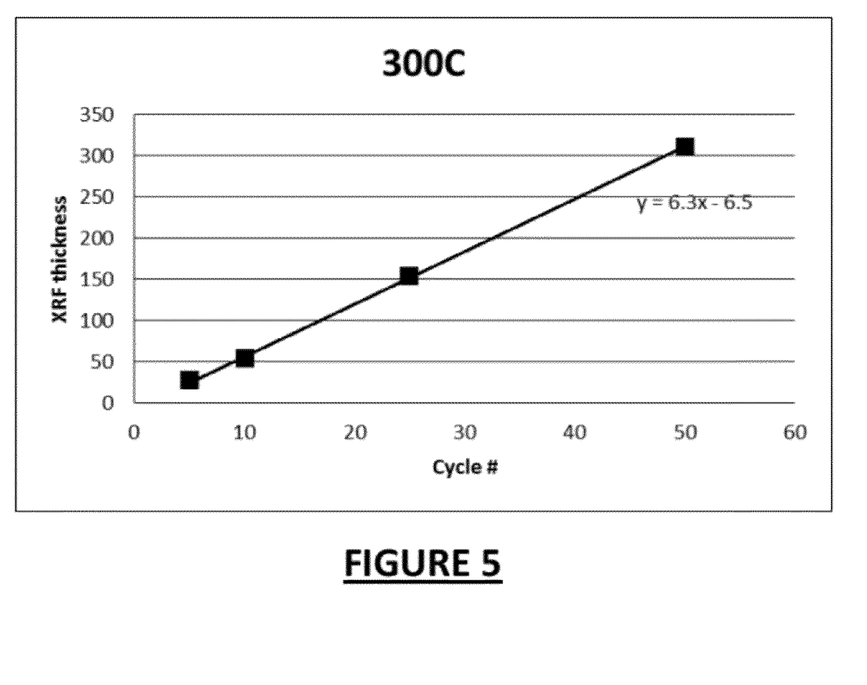
FIG. 5 is a graph showing $TaSi_x$ thickness versus deposition cycle carried out at 300° C. using TaAlC as a nucleation layer. $TaSi_x$ was deposited using $TaF_5$ and $SiH_4$ as precursors.

$TaSi_x$ was deposited onto a substrate with a TaAlC nucleation layer. $TaSi_x$ was deposited during an atomic layer deposition using $TaF_5$ and $SiH_4$ as precursors. The deposition was carried out at 300°. FIG. 5 is a graphical representation of $TaSi_x$ thickness versus deposition cycle carried out at 300° C. The film resistivity was about 250-300 μohm-cm.

Example 5

Figure 6:
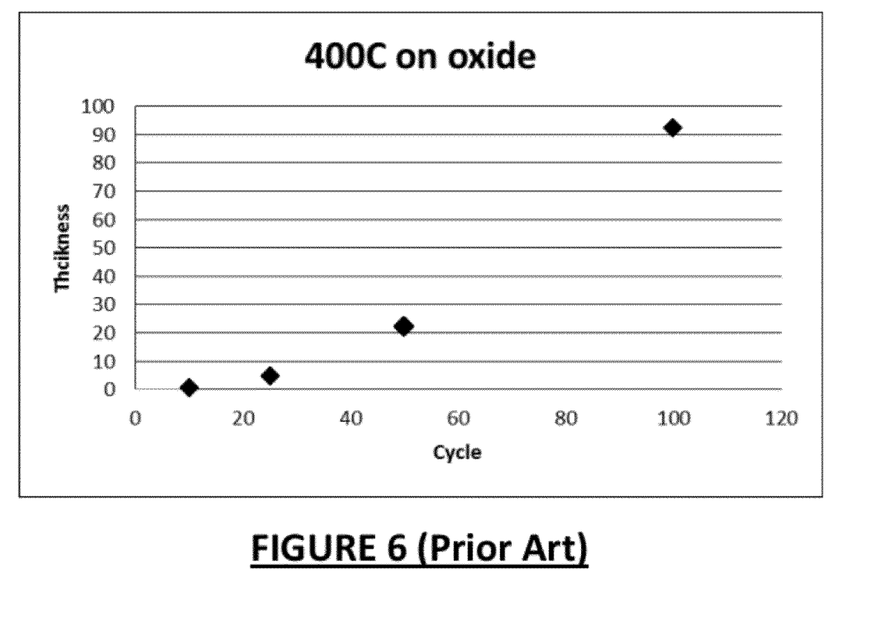
FIG. 6 (prior art) is a graph showing $TaSi_x$ deposition thickness versus deposition cycle at 400° C., where the $TaSi_x$ is directly deposited onto an oxide substrate. $TaSi_x$ was formed using $TaCl_5$ and $SiH_4$ as precursors.

Comparative $TaSi_x$ was directly deposited onto an oxide substrate. No initiation layer was deposited. $TaSi_x$ was deposited during an atomic layer deposition process using $TaCl_5$ and $SiH_4$ as precursors. FIG. 6 is a graphical representation of $TaSi_x$ deposition thickness versus deposition cycle at 400° C.

Example 6

Figure 7:
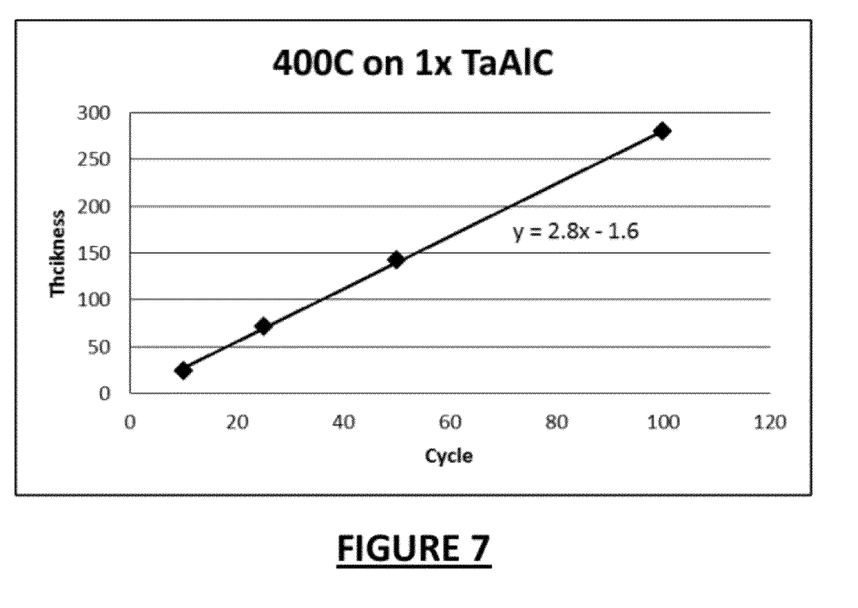
FIG. 7 is a graph showing $TaSi_x$ thickness versus deposition cycle at 400° C. The $TaSi_x$ was deposited onto one deposition cycle of a TaAlC nucleation layer. $TaSi_x$ was formed using $TaCl_5$ and $SiH_4$ as precursors.

The $TaSi_x$ was deposited onto one deposition cycle of a TaAlC nucleation layer. $TaSi_x$ was formed using $TaCl_5$ and $SiH_4$ as precursors during an atomic layer deposition process. FIG. 7 is a graphical representation of $TaSi_x$ thickness versus deposition cycle at 400° C.

Example 7

Figure 8:
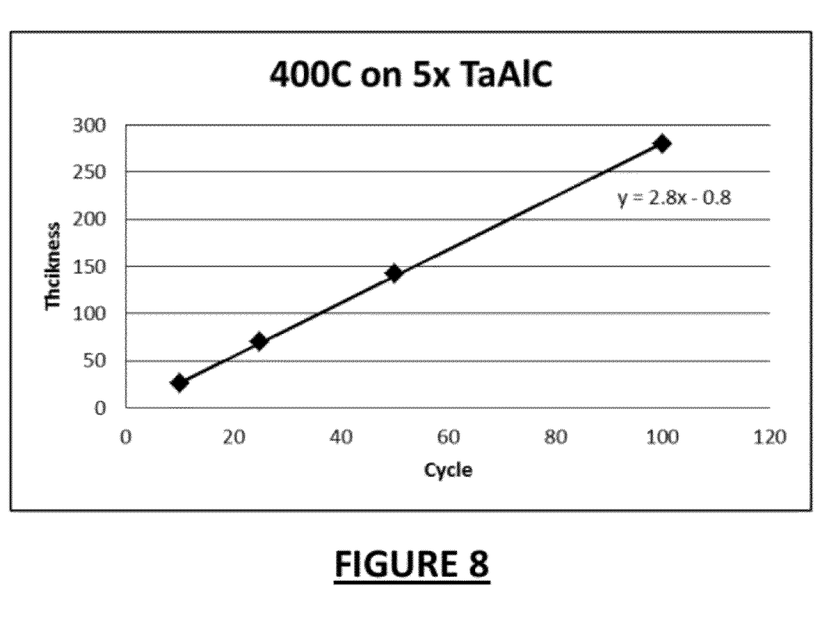
FIG. 8 is a graph showing $TaSi_x$ thickness versus deposition cycle at 400° C. The $TaSi_x$ was deposited onto five deposition cycles of a TaAlC nucleation layer. $TaSi_x$ was formed using $TaCl_5$ and $SiH_4$ as precursors.

$TaSi_x$ was deposited onto five deposition cycles of a TaAlC nucleation layer. FIG. 8 is a graphical representation of $TaSi_x$ thickness versus deposition cycle at 400° C. $TaSi_x$ was formed using $TaCl_5$ and $SiH_4$ as precursors.

TaAlC can act as a nucleation layer, even at one cycle of deposition, which FIGS. 6 through 8 demonstrate. FIG. 6 shows $TaSi_x$ deposition at 400° C. using $TaCl_5$ and $SiH_4$ precursors. FIG. 7 shows the same, but with the $TaSi_x$ as deposited onto one deposition cycle of TaAlC. The long incubation shown in FIG. 6 is greatly reduced by just one layer of TaAlC. Similarly, FIG. 8 shows $TaSi_x$ deposition onto 5 cycles of TaAlC deposition. The values and rates are very similar to those in FIG. 7, showing that even just one cycle of the initiation layer of TaAlC is very effective at eliminating the incubation period and increasing rate of $TaSi_x$ deposition.

Example 8

Figure 9A:
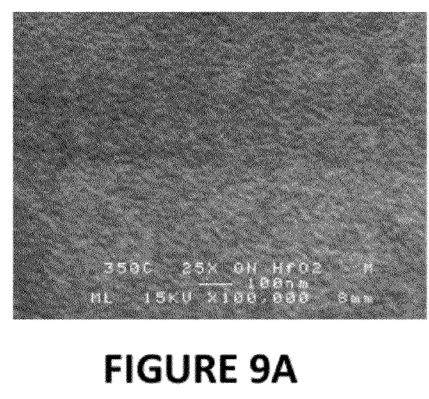
FIGS. 9A-D are scanning electron microscope images of $TaSi_x$ deposited onto a substrate using a TaAlC nucleation layer.
Figure 9B:
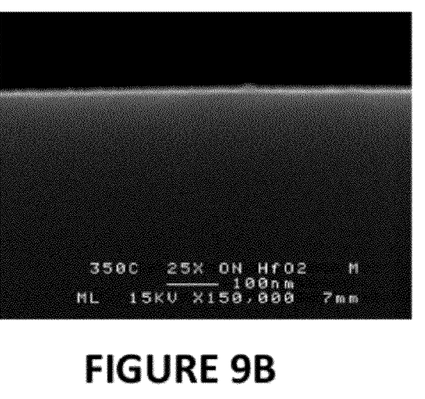
Figure 9C:
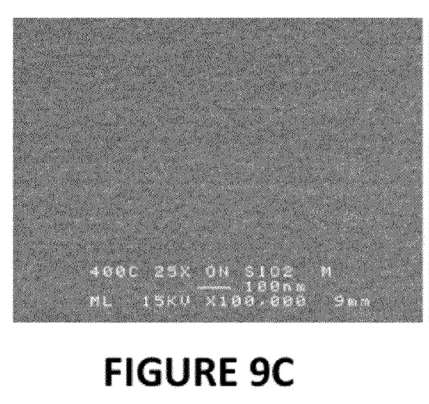
Figure 9D:
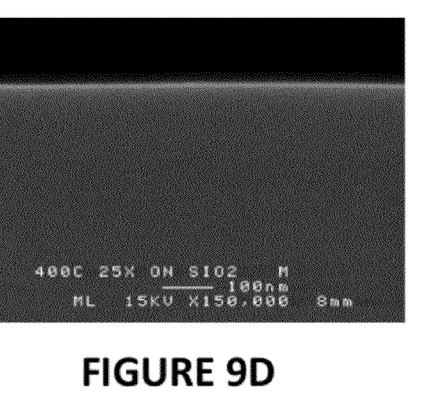

$TaSi_x$ was deposited onto a substrate using a TaAlC nucleation layer. FIGS. 9A-D are scanning electron images of the results. FIGS. 9A and 9B show twenty-five cycles of $TaSi_x$ deposited at 350° C. deposited onto a $HfO_2$ substrate using a TaAlC nucleation layer. FIGS. 9C and D show twenty-five cycles of $TaSi_x$ deposited at 400° C. deposited onto a $SiO_2$ substrate using a TaAlC nucleation layer.

Figure 10A:
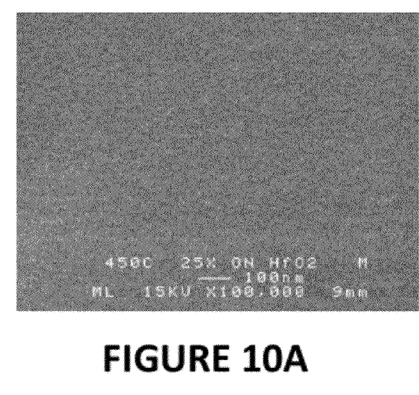
FIGS. 10A-D are scanning electron microscope images of $TaSi_x$ deposited onto a substrate using a TaAlC nucleation layer.
Figure 10B:
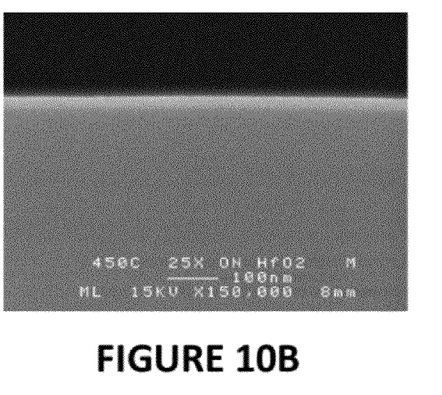
Figure 10C:
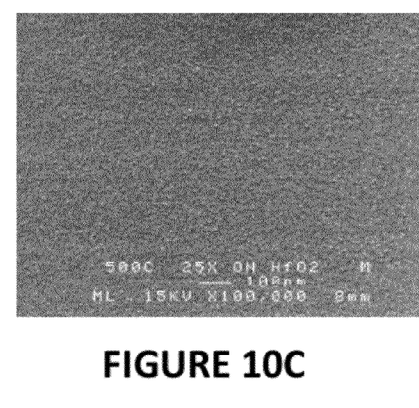
Figure 10D:
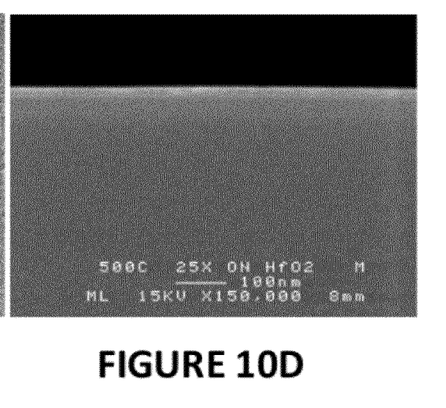

$TaSi_x$ was deposited onto a substrate using a TaAlC nucleation layer. FIGS. 10A-D are scanning electron images of the results. FIGS. 10A and 10B show twenty-five cycles of $TaSi_x$ deposited at 450° C. deposited onto a $HfO_2$ substrate using a TaAlC nucleation layer. FIGS. 10C and 10D show twenty-five cycles of $TaSi_x$ deposited at 500° C. deposited onto a $HfO_2$ substrate using a TaAlC nucleation layer.

Example 9

Figure 11:
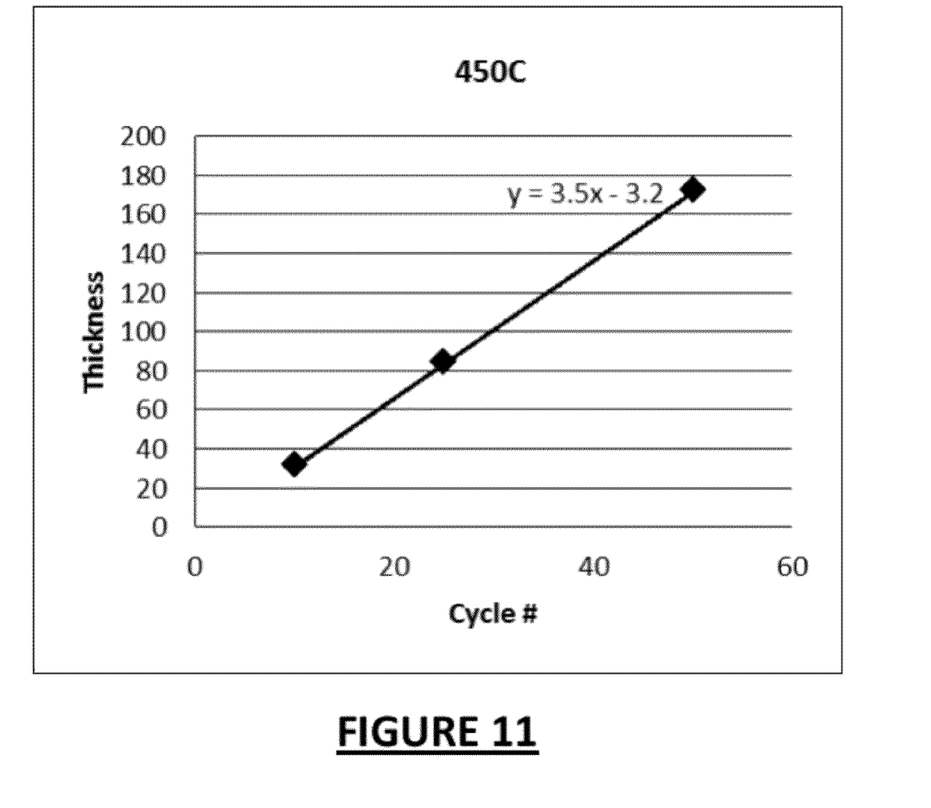
FIG. 11 is a graph showing thickness versus cycle of $TaSi_x$ deposition onto a TaAlC nucleation layer using $TaCl_5$ and $SiH_4$ as precursors at 450° C.
Figure 12:
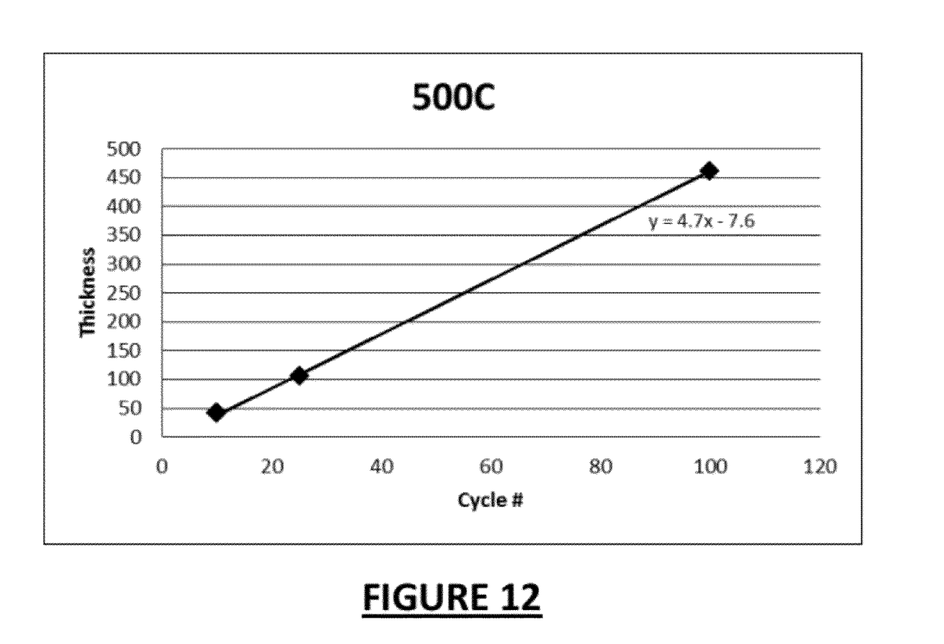
FIG. 12 is a graph showing thickness versus cycle of $TaSi_x$ deposition onto a TaAlC nucleation layer using $TaCl_5$ and $SiH_4$ as precursors at 500° C.

The deposition rate against temperature was measured. $TaSi_x$ was deposited using $TaCl_5$ and $SiH_4$ as precursors. FIG. 11 is a graphical representation of thickness versus cycle of $TaSi_x$ deposition onto a TaAlC nucleation layer using $TaCl_5$ and $SiH_4$ as precursors at 450° C. FIG. 12 is a graphical representation of thickness versus cycle of $TaSi_x$ deposition onto a TaAlC nucleation layer using $TaCl_5$ and $SiH_4$ as precursors at 500° C.

The rate of deposition increases with temperature, as shown in FIGS. 11 through 12. In all cases, $TaSi_x$ was deposited onto a TaAlC initiation layer using $TaCl_5$ and $SiH_4$ precursors. FIGS. 11 through 12 shows the rate of $TaSi_x$ deposition at 350° C. and 450° C., respectively. $TaSi_x$ deposition at 350° C. still shows a slight incubation time. However, the rate of deposition increases over the two temperatures. The rate of the line the trendline in FIG. 11 is 3.5, whereas it is 4.7 in FIG. 12. This shows a considerable increase in rate.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

The invention claimed is:

1. A method of forming a metal layer on a substrate surface, the method comprising:
  providing an initiation layer of TaM or TiM layer on a substrate, wherein M is selected from aluminum, noble metals, gallium, silicon, germanium and combinations thereof;
  exposing the substrate having the TaM or TiM layer to a treatment process comprising soaking the surface of the substrate with a reducing agent to provide a treated initiation layer; and
  depositing a metal layer upon the treated initiation layer, wherein the metal layer comprises a metal alloy selected from the group consisting of $TaSi_x$, $TiSi_x$, $TaGe_x$, and $TiGe_x$, wherein the initiation layer or metal layer comprises an aluminum dopant.

2. The method of claim 1, wherein the reducing agent comprises one or more of $SiH_4$, $B_2H_5$, alkyl tins, alkyl zincs, and aluminum hydrides.

3. The method of claim 1, wherein the metal layer comprises $TaSi_x$ doped with aluminum.

4. The method of claim 1, wherein the substrate comprises an oxide, TiN or TaN surface.

5. The method of claim 1, wherein the value of x has a range of about 2.5 to about 0.1.

6. The method of claim 1, wherein the layer thickness of the metal layer is less than about 50 Angstroms.

7. The method of claim 1, wherein the metal layer comprises $TaSi_x$.

8. The method of claim 1, wherein the initiation layer comprises TaAlC.

9. The method of claim 8, wherein the TaAlC initiation layer is deposited via an atomic layer deposition process with $TaCl_5$ and triethyl aluminum precursors.

10. A method of depositing a metal layer, the method comprising depositing an initiation layer comprising TaAlC or TaSi doped with aluminum;
  exposing the substrate having the TaAlC or $TaSi_x$ doped with aluminum initiation layer to a treatment process comprising soaking the surface of the substrate with a reducing agent to provided a treated initiation layer; and
  depositing a metal layer upon the treated initiation layer, wherein the metal layer comprises a metal alloy selected from the group consisting of $TaSi_x$, $TiSi_x$, $TaGe_x$, and $TiGe_x$.

11. The method of claim 10, wherein the reducing agent comprises one or more of $SiH_4$, $B_2H_5$, alkyl tins, alkyl zincs, and aluminum hydrides.

12. The method of claim 10, wherein the metal layer comprises $TaSi_x$ doped with aluminum.

13. The method of claim 10, wherein the value of x has a range of about 0.1 to about 2.5.

14. A method for forming a metal layer on a substrate surface, the method comprising:
  exposing a substrate to a first reactant gas comprising $TaCl_5$;
  exposing the substrate to a second reactant gas comprising triethyl aluminum to form a TaAlC layer on the substrate during an atomic layer deposition process;
  exposing the substrate having the TaAlC layer to a treatment process comprising soaking the surface of the substrate with a reducing agent to provided a treated initiation layer;
  depositing a metal layer, wherein the metal layer comprises a metal alloy selected from the group consisting of $TaSi_x$, $TiSi_x$, $TaGe_x$, and $TiGe_x$.

15. The method of claim 14, wherein the initiation layer or metal layer comprises aluminum dopant.

16. The method of claim 14, wherein the reducing agent comprises one or more of $SiH_4$, $B_2H_5$, alkyl tins, alkyl zincs, and aluminum hydrides.

17. The method of claim 16, wherein the value of x has a range of about 0.1 to about 2.5.

* * * * *